United States Patent
Hori et al.

(10) Patent No.: US 11,993,849 B2
(45) Date of Patent: May 28, 2024

(54) CARBON HARD MASK, FILM FORMING APPARATUS, AND FILM FORMING METHOD

(71) Applicants: Tokyo Electron Limited, Tokyo (JP); National University Corporation Tokai National Higher Education and Research System, Aichi (JP)

(72) Inventors: Masaru Hori, Aichi (JP); Makoto Sekine, Aichi (JP); Hirotsugu Sugiura, Aichi (JP); Tsuyoshi Moriya, Nirasaki (JP); Satoshi Tanaka, Nirasaki (JP); Yoshinori Morisada, Nirasaki (JP)

(73) Assignees: TOKYO ELECTRON LIMITED, Tokyo (JP); National University Corporation Tokai National Higher Education and Research System, Aichi (JP)

( * ) Notice: Subject to any disclaimer, the term of this patent is extended or adjusted under 35 U.S.C. 154(b) by 423 days.

(21) Appl. No.: 17/415,104

(22) PCT Filed: Dec. 4, 2019

(86) PCT No.: PCT/JP2019/047328
§ 371 (c)(1),
(2) Date: Jun. 17, 2021

(87) PCT Pub. No.: WO2020/129628
PCT Pub. Date: Jun. 25, 2020

(65) Prior Publication Data
US 2022/0042173 A1 Feb. 10, 2022

(30) Foreign Application Priority Data

Dec. 18, 2018 (JP) .................................. 2018-236009

(51) Int. Cl.
*C23C 16/52* (2006.01)
*C23C 16/26* (2006.01)
(Continued)

(52) U.S. Cl.
CPC .............. *C23C 16/52* (2013.01); *C23C 16/26* (2013.01); *H01J 37/32449* (2013.01);
(Continued)

(58) Field of Classification Search
CPC ... C23C 16/455; C23C 16/4412; C23C 16/18; C23C 16/4481; C23C 16/507;
(Continued)

(56) References Cited

U.S. PATENT DOCUMENTS

2002/0176947 A1   11/2002   Darras et al.
2009/0215274 A1*   8/2009   Matsumoto ....... H01J 37/32568
                                                                  438/758

FOREIGN PATENT DOCUMENTS

JP     2002-509845 A     4/2002
JP     2004-359482 A    12/2004
(Continued)

*Primary Examiner* — Rudy Zervigon
(74) *Attorney, Agent, or Firm* — Nath, Goldberg & Meyer; Jerald L. Meyer; Tanya E. Harkins (57) ABSTRACT

According to one embodiment, there is provided a carbon hard mask laminated on an etching target film, in which the concentration ratio of a methylene group $CH_2$ and a methyl group $CH_3$ contained in the carbon hard mask satisfies the expression $CH_2/(CH_2+CH_3) \geq 0.5$.

3 Claims, 10 Drawing Sheets

(51) Int. Cl.
  *H01J 37/32* (2006.01)
  *H01L 21/033* (2006.01)
(52) U.S. Cl.
  CPC .... *H01J 37/32816* (2013.01); *H01L 21/0332* (2013.01); *H01J 2237/332* (2013.01)
(58) Field of Classification Search
  CPC ............ C23C 16/45591; C23C 16/452; C23C 16/509; C23C 16/5096; C23C 16/45565; C23C 16/52; C23C 16/26; C23C 16/511; C23C 16/505; B05D 1/60; H01L 45/1616; H01L 21/67069; H01L 21/0332; H01L 21/02115; H01L 21/02274; H01L 21/31144; H01J 37/321; H01J 37/32082; H01J 37/3244; H01J 37/32174; H01J 15/00; H01J 37/32091; H01J 37/32623; H01J 37/32009; H01J 37/32532; H01J 37/32449; H01J 37/32816; H01J 2237/332

USPC ... 427/248.1, 569, 570, 533, 535, 96.8, 237, 427/255.23, 255.28; 216/58, 67; 118/723 I, 723 IR, 663, 666, 696, 697, 118/723 R; 156/345.48, 345.49
See application file for complete search history.

(56) References Cited

FOREIGN PATENT DOCUMENTS

| | | |
|---|---|---|
| JP | 2013-193336 A | 9/2013 |
| JP | 2013-251310 A | 12/2013 |
| JP | 2015-507363 A | 3/2015 |
| JP | 2017-103454 A | 6/2017 |

\* cited by examiner

CARBON HARD MASK, FILM FORMING APPARATUS, AND FILM FORMING METHOD

This is a National Phase Application filed under 35 U.S.C. 371 as a national stage of PCT/JP2019/047328, filed Dec. 4, 2019, an application claiming the benefit of Japanese Application No. 2018-236009, filed Dec. 18, 2018, the content of each of which is hereby incorporated by reference in its entirety.

TECHNICAL FIELD

Various aspects and embodiments of the present disclosure relate to a carbon hard mask, a film forming apparatus, and a film forming method.

BACKGROUND

For example, Patent Document 1 below discloses a method of forming a nitrogen-doped amorphous carbon layer on a substrate in a processing chamber. In this method, a sacrificial dielectric layer of a predetermined thickness is deposited on the substrate, and a patterned feature is formed on the substrate by removing a portion of the sacrificial dielectric layer to expose the upper surface of the substrate. Further, the nitrogen-doped amorphous carbon layer having a predetermined thickness is conformally deposited on the exposed upper surfaces of the patterned feature and the substrate. Then, using an anisotropic etching process, the nitrogen-doped amorphous carbon layer is selectively removed from the upper surface of the patterned feature and the upper surface of the substrate.

PRIOR ART DOCUMENT

Patent Document

Patent Document 1: Japanese National Publication of International Patent Application No. 2015-507363

The present disclosure provides embodiments of a carbon hard mask containing a hydrogen atom and having high etching resistance.

SUMMARY

According to one aspect of the present disclosure, there is provided a carbon hard mask laminated on an etching target film, in which the concentration ratio of a methylene group $CH_2$ and a methyl group CH3 contained in the carbon hard mask satisfies the expression: $CH_2/(CH_2+CH_3) \geq 0.5$.

According to various aspects and embodiments of the present disclosure, it is possible to provide a carbon hard mask containing a hydrogen atom and having high etching resistance.

DETAILED DESCRIPTION

Embodiments of the disclosed carbon hard mask, film forming apparatus, and method of forming a film will now be described in detail with reference to the drawings. The following embodiments do not limit the disclosed carbon hard mask, film forming apparatus, and method of forming a film.

By the way, as the trend for miniaturization of semiconductor integrated circuits has been accelerating in recent years, the aspect ratio of grooves and holes formed by a dry etching process is also increasing. Therefore, in order to maintain a mask pattern in the dry etching process, the mask film is required to have high etching resistance. It is conceivable to improve the etching resistance by increasing the thickness of the mask film, but if the width of the grooves and the diameter of the holes formed by the dry etching process become smaller, the mask film is more likely to collapse, which makes it more difficult to increase the thickness of the mask film. Therefore, further improvement in etching resistance of the mask film itself is required.

As a mask film having high etching resistance, for example, diamond-like carbon (DLC) is known. Although the DLC may contain hydrogen atoms, the etching resistance is further enhanced by reducing the content of hydrogen atoms in the DLC. DLC that does not contain hydrogen atoms is called hydrogen-free DLC. However, if the content of hydrogen atoms in the DLC is low, a stress on the mask film increases. When the stress is large, the mask film is distorted or cracked, thereby lowering the dimensional accuracy of a mask pattern. Therefore, the dimensional accuracy of the shapes of the grooves and holes formed by the dry etching process is lowered.

Therefore, the present disclosure provides a carbon hard mask containing a hydrogen atom and having high etching resistance.

[Configuration of Film Forming Apparatus 10]

Figure 1:
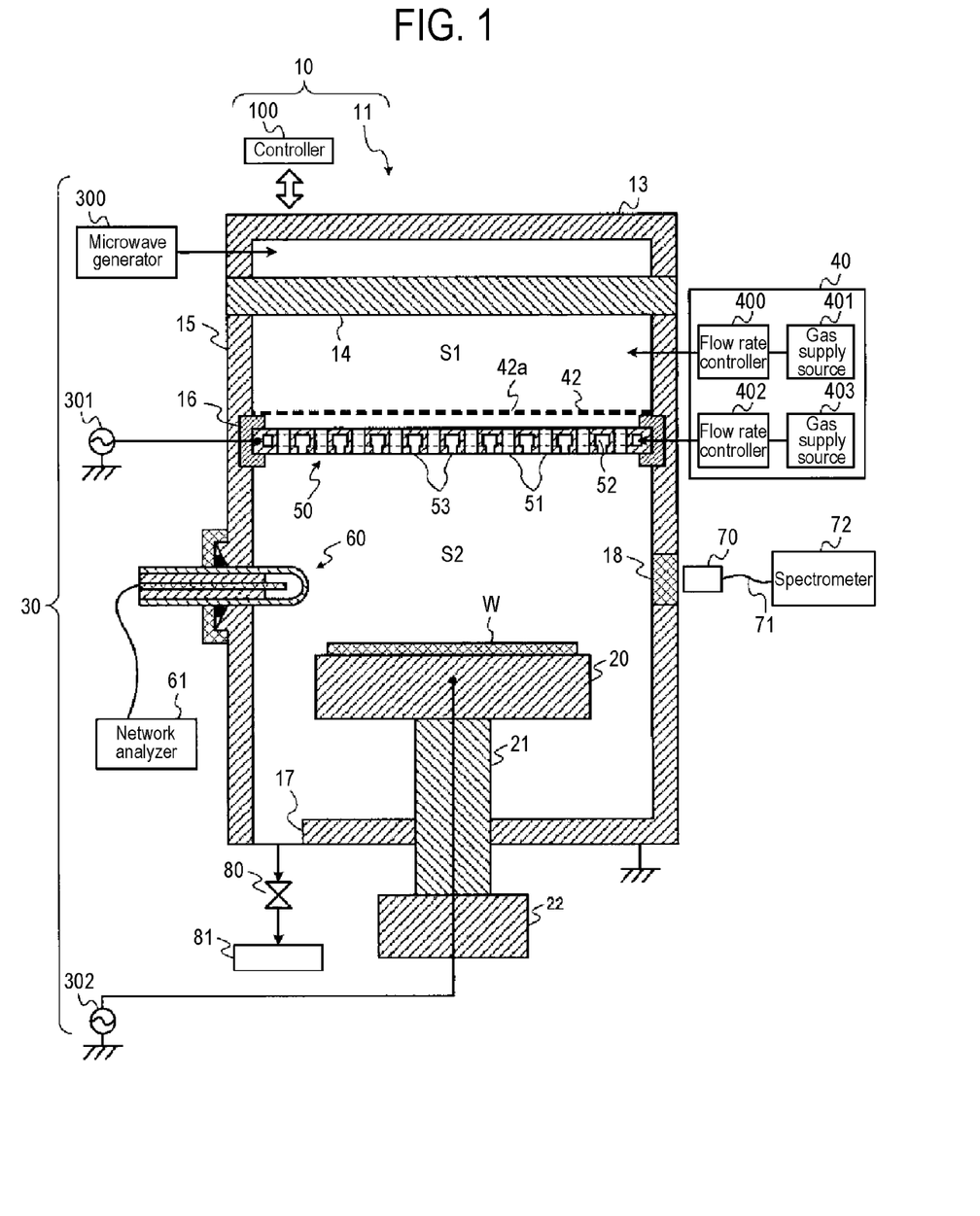
FIG. 1 is a schematic cross-sectional view illustrating an example of a film forming apparatus according to one embodiment of the present disclosure.

FIG. 1 is a schematic cross-sectional view illustrating an example of a film forming apparatus 10 according to one embodiment of the present disclosure. The film forming apparatus 10 according to the present embodiment turns a hydrogen gas into plasma by power having a microwave band of frequency, and turns a carbon-containing gas into plasma by power having a VHF (Very High Frequency) band of frequency. Then, the film forming apparatus 10 forms a mask film, which can be used as an etching mask, on an object, which is an etching target film, by using ions and active species contained in the plasma. The mask film formed according to the present embodiment is an example of a carbon hard mask. The etching target film is, for example, $SiO_2$.

The film forming apparatus 10 includes a device main body 11 and a controller 100, as illustrated, for example, in FIG. 1. The controller 100 controls various parts of the device main body 11. The device main body 11 has a substantially cylindrical chamber 15 with a bottom and an upper opening. The upper part of the chamber 15 is blocked by a dielectric plate 14 such as quartz, and a waveguide 13 for guiding microwaves is provided on the dielectric plate 14. A power supply 30 is connected to the waveguide 13. The power supply 30 includes a microwave generator 300, a radio frequency power supply 301, and a radio frequency power supply 302. Microwaves having a predetermined frequency and predetermined electric power generated by the microwave generator 300 are supplied to the waveguide 13. In the present embodiment, the microwave generator 300 supplies the waveguide 13 with microwaves having, for example, a frequency of 2.45 [GHz] and power of several hundred [W] (for example, 400 [W]). The microwaves supplied into the waveguide 13 are radiated into the chamber 15 via the dielectric plate 14. The microwave generator 300 is an example of a first power supply.

The chamber 15 is vertically partitioned by a partition plate 50. In the following, in the chamber 15, a space above the partition plate 50 is defined as a first plasma chamber S1, and a space below the partition plate 50 is defined as a second plasma chamber S2. The chamber 15 is made of metal such as aluminum and, for example, a thermally-sprayed film made of a plasma-resistant material is formed on the inner wall thereof. The chamber 15 is grounded.

A gas supply 40 is connected to the first plasma chamber S1. The gas supply 40 includes a flow rate controller 400, a gas supply source 401, a flow rate controller 402, and a gas supply source 403. A hydrogen gas is supplied from the gas supply source 401 into the first plasma chamber S1 via the flow rate controller 400. A flow rate of the hydrogen gas supplied into the first plasma chamber S1 is controlled by the flow rate controller 400. The flow rate controller 400 is an example of a first gas supply.

In the present embodiment, the flow rate of the hydrogen gas supplied into the first plasma chamber S1 is controlled to, for example, 25 to 133 [sccm]. The hydrogen gas supplied into the first plasma chamber S1 is turned into plasma by microwaves radiated into the first plasma chamber S1 via the dielectric plate 14. The plasma includes hydrogen ions, hydrogen radicals, electrons, and the like.

A metal mesh 42 made of metal and having a plurality of openings 42a is provided above the partition plate 50 in the lower portion of the first plasma chamber S1. The metal mesh 42 is electrically connected to the sidewall of the chamber 15 and is grounded via the chamber 15. The metal mesh 42 is provided to suppress invasion of charged particles such as hydrogen ions and electrons contained in the plasma in the first plasma chamber S1 into the second plasma chamber S2. Further, the metal mesh 42 is provided to suppress leakage of a radio frequency supplied to the partition plate 50 into the first plasma chamber S1.

An insulating member 16 is provided on the sidewall of the chamber 15, and the partition plate 50 is supported by the sidewall of the chamber 15 via the insulating member 16. The partition plate 50 is made of metal such as aluminum, and a thermally-sprayed film made of a plasma-resistant material is formed on the surface of the partition plate 50. The radio frequency power supply 301 in the power supply 30 is electrically connected to the partition plate 50.

The radio frequency power supply 301 supplies the partition plate 50 with radio frequency power having a VHF band of frequency. The radio frequency power supply 301 supplies the partition plate 50 with radio frequency power having, for example, a frequency of 100 [MHz] to 300 [MHz] and power of 20 [W] to 300 [W]. In the present embodiment, the radio frequency power supply 301 supplies the partition plate 50 with radio frequency power having, for example, a frequency of 100 [MHz] and power of 100 [W]. The radio frequency power supply 301 is an example of a second power supply.

Figure 2:
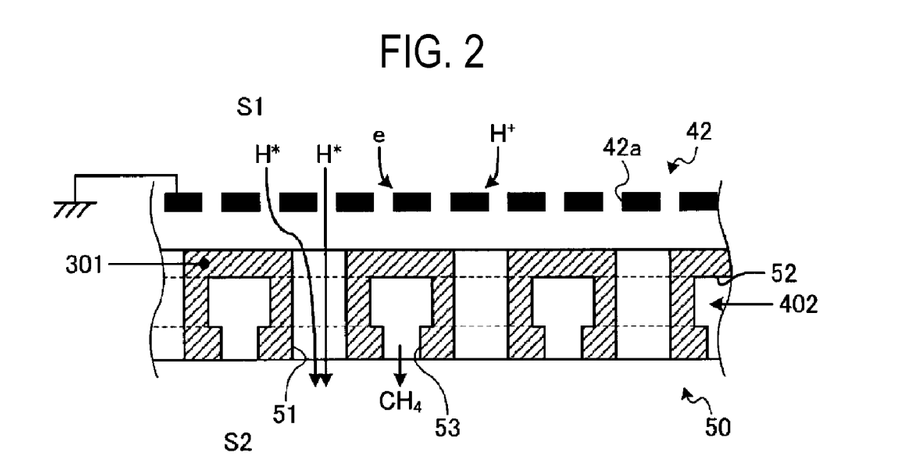
FIG. 2 is an enlarged cross-sectional view illustrating an example of a partition plate according to one embodiment of the present disclosure.

FIG. 2 is an enlarged cross-sectional view illustrating an example of the partition plate 50 according to one embodiment of the present disclosure. The partition plate 50 is formed with a plurality of through-ports 51 penetrating the partition plate 50 in the thickness direction thereof. The first plasma chamber S1 and the second plasma chamber S2 communicate with each other via openings 42a of the metal mesh 42 and the through-ports 51 of the partition plate 50. As a result, the hydrogen radicals contained in the plasma generated in the first plasma chamber S1 are supplied into the second plasma chamber S2 via the openings 42a of the metal mesh 42 and the through-ports 51 of the partition plate 50.

A diffusion space 52 is formed within the partition plate 50, and a plurality of discharge ports 53 are formed in the lower portion of the diffusion space 52. The flow rate controller 402 is connected to the diffusion space 52. A carbon-containing gas is supplied from the gas supply source 403 into the diffusion space 52 via the flow rate controller 402. The flow rate of the carbon-containing gas supplied into the second plasma chamber S2 is controlled by the flow rate controller 402. The flow rate controller 402 is an example of a second gas supply.

In the present embodiment, the flow rate of the carbon-containing gas supplied into the second plasma chamber S2 is controlled to, for example, 50 to 266 [sccm]. The carbon-containing gas supplied into the diffusion space 52 is supplied from each discharge port 53 into the second plasma chamber S2. The carbon-containing gas supplied into the second plasma chamber S2 is turned into plasma by the radio frequency supplied from the radio frequency power supply 301 to the partition plate 50.

In this embodiment, the carbon-containing gas is, for example, a methane ($CH_4$) gas. In addition to the methane gas, the carbon-containing gases may be an acetylene ($C_2H_2$) gas, an ethylene ($C_2H_4$) gas, an ethane ($C_2H_6$) gas, a propylene ($C_3H_6$) gas, a propyne ($C_3H_4$) gas, a propane ($C_3H_8$) gas, a butane ($C_4H_{10}$) gas, a butylene ($C_4H_8$) gas, a butadiene ($C_4H_6$) gas, a phenylacetylene ($C_8H_6$) gas, or a mixed gas including one or more selected from these gases.

A stage 20 on which the object W is placed is provided within the second plasma chamber S2. The stage 20 is made of metal such as aluminum whose surface has been anodized, for example. A temperature control mechanism (not shown) is built in the stage 20 so that the temperature of the object W placed on the stage 20 can be controlled to a predetermined temperature.

Further, the radio frequency power supply 302 in the power supply 30 is electrically connected to the stage 20. The radio frequency power supply 302 supplies the stage 20 with radio frequency power having a HF (High Frequency) or less band of frequency, for example, a frequency of several hundred [kHz] to 30 [MHz]. In the present embodiment, the radio frequency power supply 302 supplies the stage 20 with radio frequency power having a frequency of 13.56 [MHz] and power of 50 [W]. The radio frequency power supply 302 is an example of a third power supply.

The $CH_4$ gas supplied into the second plasma chamber S2 is turned into plasma between the partition plate 50 and the object W on the stage 20. Then, a mask film is formed on the object W by the ions, radicals, electrons, and the like contained in the plasma and the hydrogen radicals supplied from the first plasma chamber S1 via the through-ports 51 of the partition plate 50.

The stage 20 is supported by a support member 21, and the support member 21 can be moved up and down by an actuator 22. As the support member 21 moves up and down, the stage 20 also moves up and down. By moving the stage 20 up and down, the volume of a plasma generation space between the partition plate 50 and the object W on the stage 20 can be changed. The actuator 22 is an example of a volume adjusting part.

Here, the residence time τ of a gas in the plasma generation space of the second plasma chamber S2 increases with the increase in the volume and pressure in the plasma generation space, and decreases with the increase in the flow rate of the gas supplied into the plasma generation space. Therefore, the residence time τ of the gas in the plasma generation space can be changed by changing at least one of the flow rates of the hydrogen gas and the carbon-containing gas, the internal pressure of the chamber 15, and the volume of the plasma generation space. The flow rate of the hydrogen gas can be changed by the flow rate controller 400, and the flow rate of the carbon-containing gas can be changed by the flow rate controller 402. The internal pressure of the chamber 15 can be changed by an APC valve 80 which will be described later. The volume of the plasma generation space can be changed by moving the stage 20 up and down by the actuator 22.

An opening 17 is formed at the bottom of the chamber 15, and an exhaust device 81 is connected to the opening 17 via an exhaust pipe and the APC (Auto Pressure Controller) valve 80. A gas in the chamber 15 is exhausted by driving the exhaust device 81, and the internal pressure of the chamber 15 is controlled by adjusting the APC valve 80. The APC valve 80 is an example of a pressure adjustment part. In this embodiment, the internal pressure of the chamber 15 is controlled to, for example, 2 to 6 [Pa].

Figure 3:
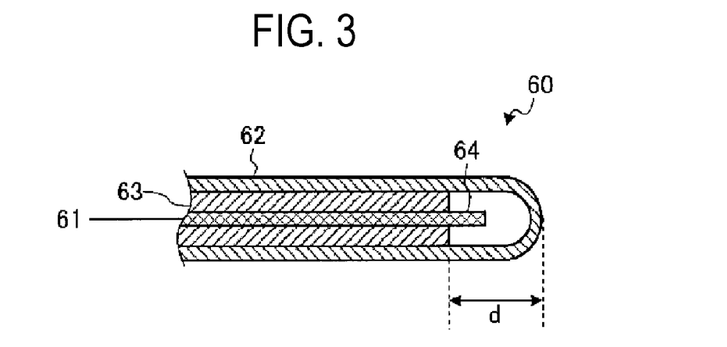
FIG. 3 is an enlarged cross-sectional view illustrating an example of a probe according to one embodiment of the present disclosure.

A probe 60 for measuring the condition of the plasma in the second plasma chamber S2 is attached to the sidewall of the chamber 15. A network analyzer 61 is connected to the probe 60. FIG. 3 is an enlarged cross-sectional view illustrating an example of the probe 60 according to one embodiment of the present disclosure. The probe 60 has a quartz tube 62 and a coaxial cable 63 disposed within the quartz tube 62.

The leading end of an inner conductor 64 of the coaxial cable 63 is exposed inside the quartz tube 62 and functions as a monopole antenna. In the present embodiment, a distance d from the root of the exposed leading end of the inner conductor 64 to a leading end of the quartz tube 62 is, for example, 6 mm.

The network analyzer 61 connected to the probe 60 calculates the reflectance of current for each frequency from the ratio of a current supplied to the coaxial cable 63 and a current returned from the coaxial cable 63 due to reflection, while changing the frequency of the current supplied to the coaxial cable 63. When the frequency of the current supplied to the coaxial cable 63 is close to a resonance frequency $f_{sw}$ of the plasma generated in the second plasma chamber S2, the reflectance of current at that frequency decreases. The plasma resonance frequency $f_{sw}$ can be estimated from a ratio of a reflectance $I_{plasma-ON}$ when the plasma is generated in the second plasma chamber S2 and a reflectance $I_{plasma-OFF}$ when no plasma is generated in the second plasma chamber S2.

Further, from the estimated resonance frequency $f_{sw}$ [GHz], the electron density $N_e$ [cm$^{-3}$] in the plasma can be estimated based on, for example, the following equation (1):

[Equation 1]

$$N_e = 1.24(1+\varepsilon_d)f_{sw}^2 \times 10^{10} \qquad (1)$$

In the above equation (1), 249$_d$ is a dielectric constant of the quartz tube 62. The dielectric constant $\varepsilon_d$ of quartz is, for example, 3.78.

Figure 4:
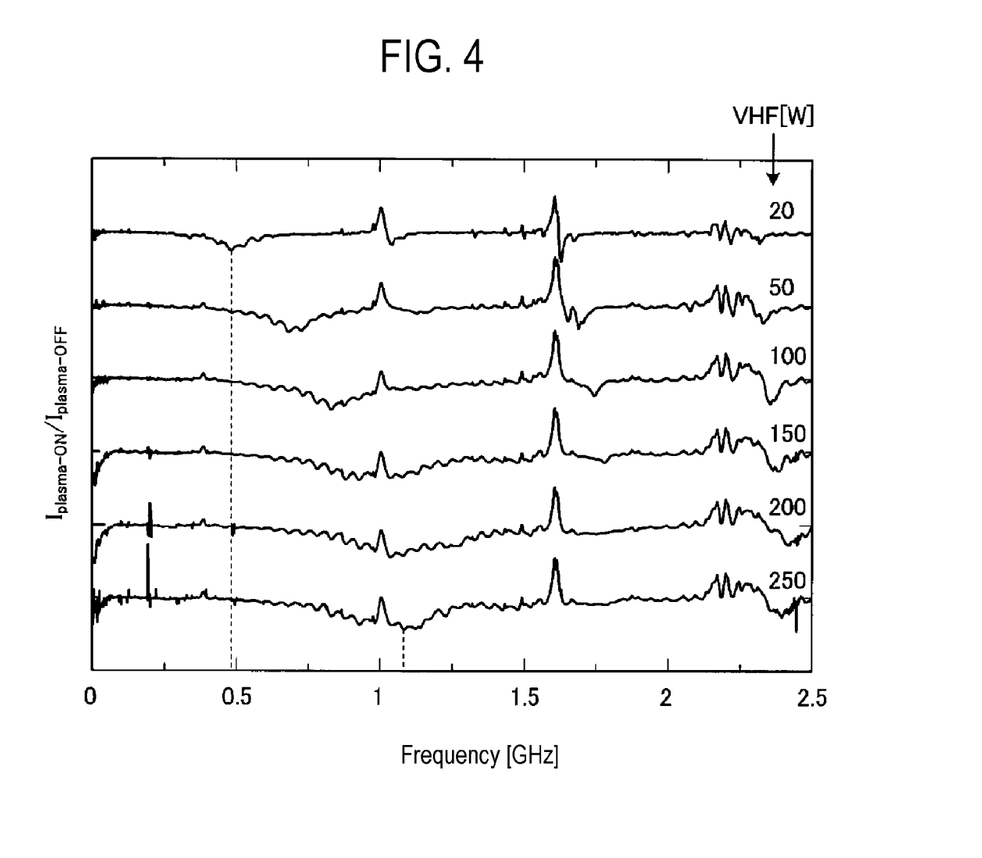
FIG. 4 is a diagram illustrating an example of a measurement result of the reflectance ratio according to one embodiment of the present disclosure.

FIG. 4 is a diagram illustrating an example of a measurement result of the reflectance ratio according to one embodiment of the present disclosure. When the radio frequency power of the VHF band supplied from the radio frequency power supply 301 is 20 [W], referring to FIG. 4, the reflectance ratio of the current supplied to the coaxial cable 63 decreases in the vicinity of 0.49 [GHz]. Therefore, the resonance frequency $f_{sw}$ can be estimated to be 0.49 [GHz]. When this resonance frequency $f_{sw}$ is applied to the above equation (1), the electron density $N_e$ is estimated to be 1.4×10$^{10}$ [cm$^{-3}$].

Further, for example, when the radio frequency power of the VHF band supplied from the radio frequency power supply 301 is 250 [W], referring to FIG. 4, the reflectance ratio of the current supplied to the coaxial cable 63 decreases in the vicinity of 1.04 [GHz]. Therefore, the resonance frequency $f_{sw}$ can be estimated to be 1.04 [GHz]. When this resonance frequency $f_{sw}$ is applied to the above equation (1), the electron density $N_e$ is estimated to be 6.4×10$^{10}$ [cm$^{-3}$]. The electron density $N_e$ can be controlled by changing the power and frequency of the radio frequency power of the VHF band supplied from the radio frequency power supply 301.

Returning to FIG. 1, the description continues. A quartz window 18 is provided on the sidewall of the chamber 15. Light emitted by elements of ions and radicals in the second plasma chamber S2 is received by a light receiving part 70 provided outside the chamber 15 via the quartz window 18. The light received by the light receiving part 70 is input to a spectrometer 72 via an optical fiber 71. The spectrometer 72 measures the intensity of the light received by the light receiving part 70 for each wavelength.

Figure 5:
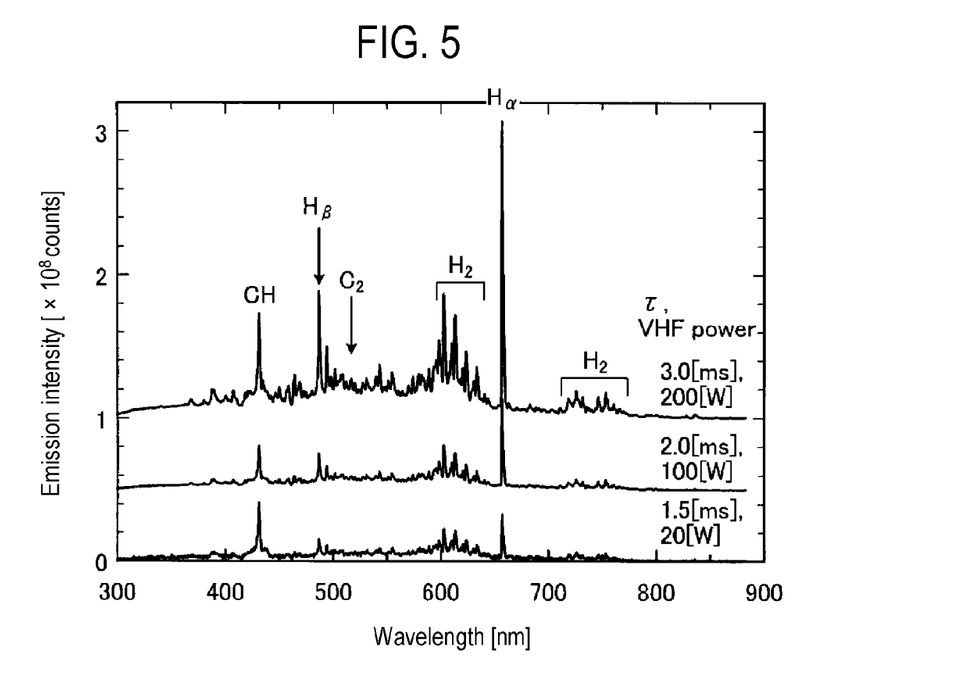
FIG. 5 is a diagram illustrating an example of an emission spectrum of plasma in a second plasma chamber according to one embodiment of the present disclosure.

FIG. 5 is a diagram illustrating an example of an emission spectrum of the plasma in the second plasma chamber S2 according to one embodiment of the present disclosure. FIG. 5 illustrates the emission spectrum for each combination of the gas residence time ti in the plasma generation space of the second plasma chamber S2 and the radio frequency power of the VHF band supplied to the partition plate 50. The emission spectrum measured by the spectrometer 72 is used to estimate the electron density of the plasma.

In the present embodiment, for example, a two-line intensity comparison method is used to estimate an excitation temperature of a hydrogen atom in the second plasma chamber S2. When the excitation temperature of the hydrogen atom is represented by $T_e$, the emission intensity at a wavelength $H_\alpha$ in FIG. 5 is represented by $I_{H\alpha}$, and the emission intensity at a wavelength $H_\beta$ in FIG. 5 is represented by $I_{H\beta}$, the excitation temperature $T_e$ of the hydrogen atom, the emission intensity $I_{H\alpha}$, and the emission intensity $I_{H\beta}$ satisfy, for example, the relationship of the following equation (2):

[Equation 2]

$$\frac{I_{H\alpha}}{I_{H\beta}} = \frac{\nu_{H\alpha} A_{H\alpha} g_3}{\nu_{H\beta} A_{H\beta} g_4} \exp\left(-\frac{E_i - E_k}{k_B T_e}\right) \quad (2)$$

In the above equation (2), v is frequency, A is transition probability, g is degeneracy, E is potential energy, and $k_B$ is the Boltzmann constant. By solving the above equation (2) with respect to the excitation temperature $T_e$ of the hydrogen atom, an estimated value of the excitation temperature $T_e$ of the hydrogen atom can be obtained. The excitation temperature $T_e$ of the hydrogen atom has a proportional relationship with the electron temperature and can be controlled by, for example, changing the power and frequency of the radio frequency of the VHF band supplied from the radio frequency power supply 301.

Returning to FIG. 1, the description continues. The controller 100 has a processor, a memory, and an input/output interface. Programs, process recipes, and the like are stored in the memory of the controller 100. The processor of the controller 100 controls various parts of the device main body 11 through the input/output interface according to the process recipes read from the memory by executing the programs read from the memory.

[Characteristics of Formed Mask Film]

In order to increase the etching resistance of the mask film to be formed, the inventors formed a mask film under various process conditions by using the film forming apparatus 10 illustrated in FIG. 1. Then, the inventors succeeded in forming a mask film having higher etching resistance than a conventional one.

As a result of examining the compositions of mask films formed under different process conditions, it was found that the etching resistance was higher than a conventional one when the concentration ratio $R_{CH}$ of a methylene group $CH_2$ and a methyl group $CH_3$ contained in the mask film was equal to or higher than a predetermined value. In the present embodiment, the concentration ratio $R_{CH}$ is defined as, for example, the following equation (3):

[Equation 3]

$$R_{CH} = \frac{CH_2}{CH_2 + CH_3} \quad (3)$$

Figure 6:
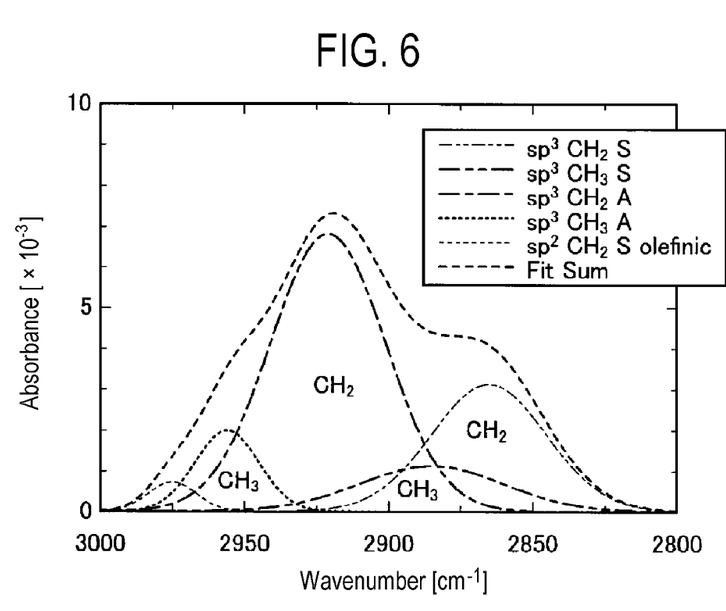
FIG. 6 is a diagram illustrating an example of a FTIR (Fourier Transform InfraRed spectroscopy) spectrum of a mask film according to one embodiment of the present disclosure.

FIG. 6 is a diagram illustrating an example of a FTIR spectrum of a mask film according to one embodiment of the present disclosure. $CH_2$ in the above equation (3) corresponds to the total peak area of $CH_2$ in the spectrum of FIG. 6, and $CH_3$ in the above equation (3) corresponds to the total peak area of $CH_3$ in the spectrum of FIG. 6. Therefore, the concentration ratio $R_{CH}$ of the methylene group $CH_2$ and the methyl group $CH_3$ contained in the mask film can be estimated by referring to the area of each peak in the spectrum of the mask film.

Figure 7:
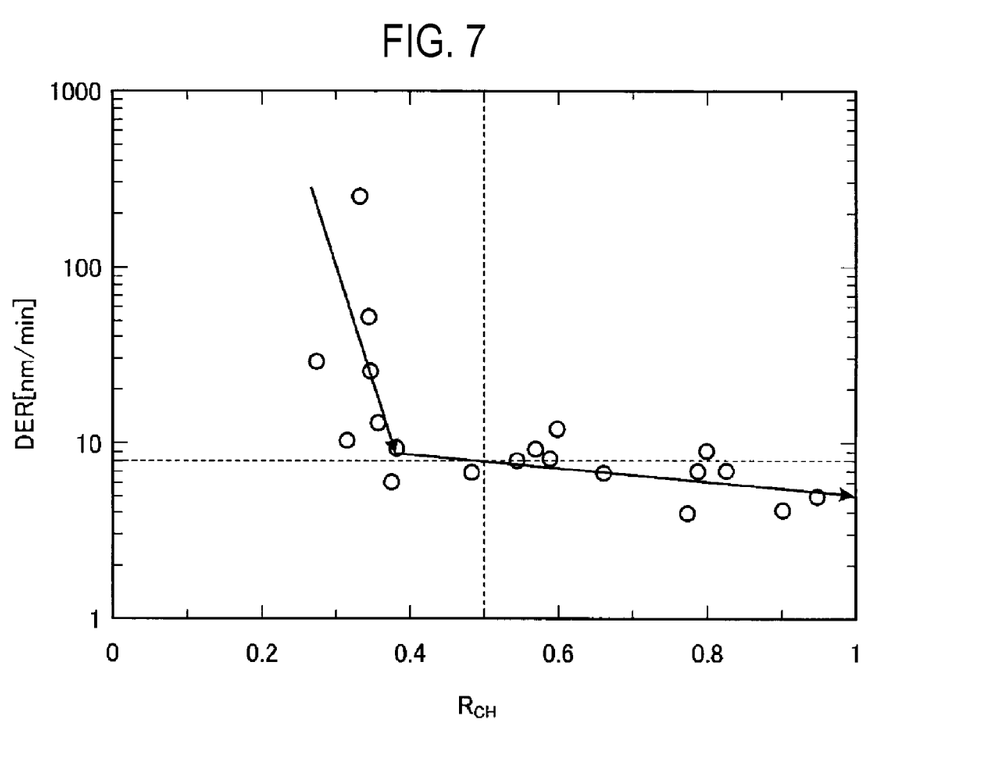
FIG. 7 is a diagram illustrating an example of a relationship between a concentration ratio and a dry etching rate (DER) according to one embodiment of the present disclosure.

The dry etching rate (DER) of a plurality of mask films having different concentration ratios $R_{CH}$ of the methylene group $CH_2$ and the methyl group $CH_3$ was measured. FIG. 7 is a diagram illustrating an example of a relationship between the concentration ratio $R_{CH}$ and the DER according to one embodiment of the present disclosure. For example, as illustrated in FIG. 7, in a range where the concentration ratio $R_{CH}$ is 0 to 0.4, the DER decreases with the increase in the concentration ratio $R_{CH}$. Further, in a range where the concentration ratio $R_{CH}$ is larger than 0.4, although the DER decreases with the increase in the concentration ratio $R_{CH}$, the rate of decrease thereof is lower than that in the range where the concentration ratio $R_{CH}$ is 0 to 0.4.

The etching rate of a conventional mask film measured as a comparative example was about 8 [nm/min]. Therefore, from the experimental result of FIG. 7, it is preferable that the concentration ratio $R_{CH}$ is 0.5 or more in order to realize a lower etching rate than a conventional one, that is, a higher etching resistance than a conventional one. That is, it is preferable that $CH_2/(CH_2+PCH_3) \geq 0.5$.

[Process Conditions]

Next, the process conditions for achieving the concentration ratio $R_{CH}$ of 0.5 or more were examined. In order to increase the etching resistance of the mask film, it is necessary to adjust the residence time of hydrogen radicals and the discharge power in the plasma generation space of the second plasma chamber S2 to fall within a predetermined range. As a result, both suppression of excessive dissociation and securing the amount of film-forming precursor are achieved. For that purpose, it is necessary to adjust the radio frequency power of the VHF band supplied from the radio frequency power supply 301 into the second plasma chamber S2, the flow rates of the hydrogen gas and the $CH_4$ gas, the internal pressure of the second plasma chamber S2, the volume of the plasma generation space of the second plasma chamber S2, and the like.

As a result of diligent examination, the inventors defined a dissociation index $i_D$ represented by, for example, the following equation (4) and have found that there is a correlation between the concentration ratio $R_{CH}$ and the dissociation index $i_D$.

[Equation 4]

$$i_D := N_e \langle \sigma v \rangle \tau \quad (4)$$

In the above equation (4), $N_e$ is the electron density in the plasma generated in the second plasma chamber S2. Further, $\langle \sigma v \rangle$ is a reaction rate constant in the reaction process of $CH_4 e \rightarrow CH_3 + H + e$ and is calculated using, for example, the following equation (5):

[Equation 5]

$$\langle \sigma v \rangle = \int_0^{30} \sigma_{CH3}(E) \left(\frac{2E}{m_e}\right)^{1/2} f(E) dE \quad (5)$$

In the above equation (5), $\sigma_{CH3}$ is the ionization cross section in the reaction process of $CH_4+e \rightarrow CH_3+H+e$. Further, $(2E/m_e)^{1/2}$ is the velocity of electrons, and f(E) is an EEDF (Electron Energy Distribution Function).

Figure 8:
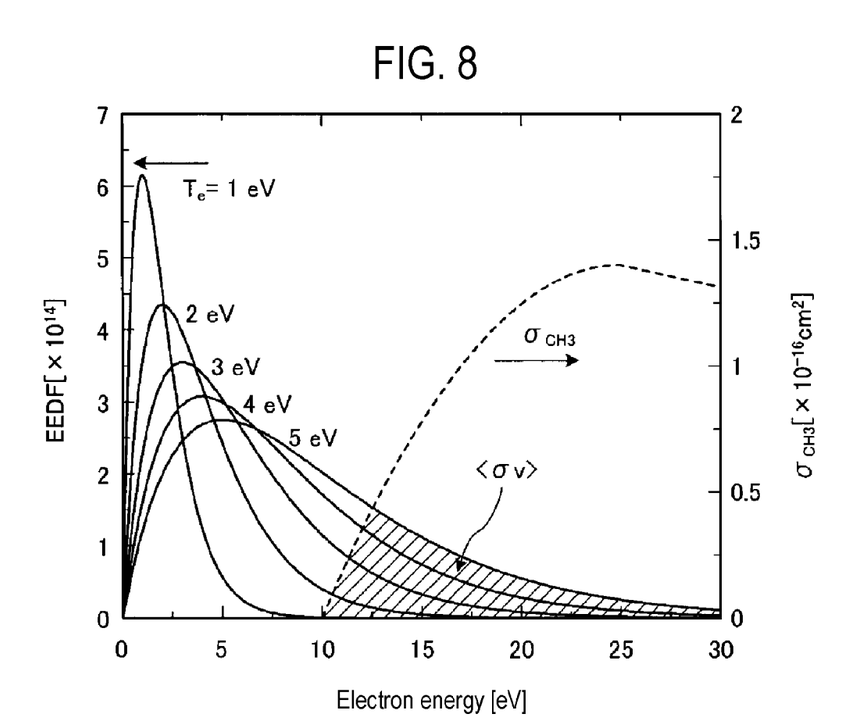
FIG. 8 is a diagram illustrating an example of an EEDF (Electron Energy Distribution Function).

The EEDF for each excitation temperature $T_e$ of the hydrogen atom is illustrated, for example, in FIG. 8. FIG. 8 is a diagram illustrating an example of the EEDF. FIG. 8 also illustrates an example of the ionization cross section $\sigma_{CH3}$ for electron energy. The reaction rate constant $\langle \sigma v \rangle$ is represented by the product of the EEDF and the ionization cross section, that is, the area of a shaded region in FIG. 8.

Figure 9:
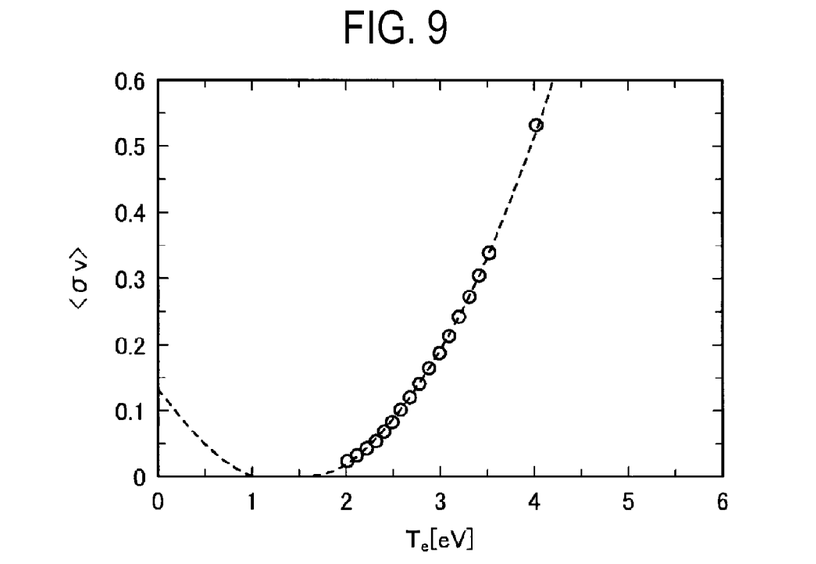
FIG. 9 is a diagram illustrating an example of a relationship between a reaction rate coefficient and an excitation temperature of a hydrogen atom.

Here, it was found that the reaction rate constant $\langle \sigma v \rangle$ and the excitation temperature $T_e$ of the hydrogen atom have a relationship as illustrated, for example, in FIG. 9. FIG. 9 is a diagram illustrating an example of the relationship between the reaction rate coefficient $\langle \sigma v \rangle$ and the excitation temperature $T_e$ of the hydrogen atom. Referring to FIG. 9, in a range where the excitation temperature $T_e$ of the hydrogen atom is 2 to 4 [eV], the reaction rate constant $\langle \sigma v \rangle$ is proportional to the square of the excitation temperature $T_e$ of the hydrogen atom. That is, the dissociation index $i_D$ can be redefined as the following equation (6):

[Equation 6]

$$i_D := N_e \langle \sigma v \rangle \tau \qquad (6)$$
$$\propto N_e T_e^2 \tau$$

In the following, the description will be given using the dissociation index $i_D$ defined by the above equation (6). In the above equation (6), the electron density $N_e$ can be estimated using, for example, the reflectance ratio measured using the probe 60 and the above equation (1). Further, the excitation temperature $T_e$ of the hydrogen atom can be estimated using the emission spectrum measured by the spectrometer 72 and the above equation (2). Further, the residence time $\tau$ [ms] can be estimated based on the volume and internal pressure of the plasma generation space and the flow rate of a gas.

Figure 10:
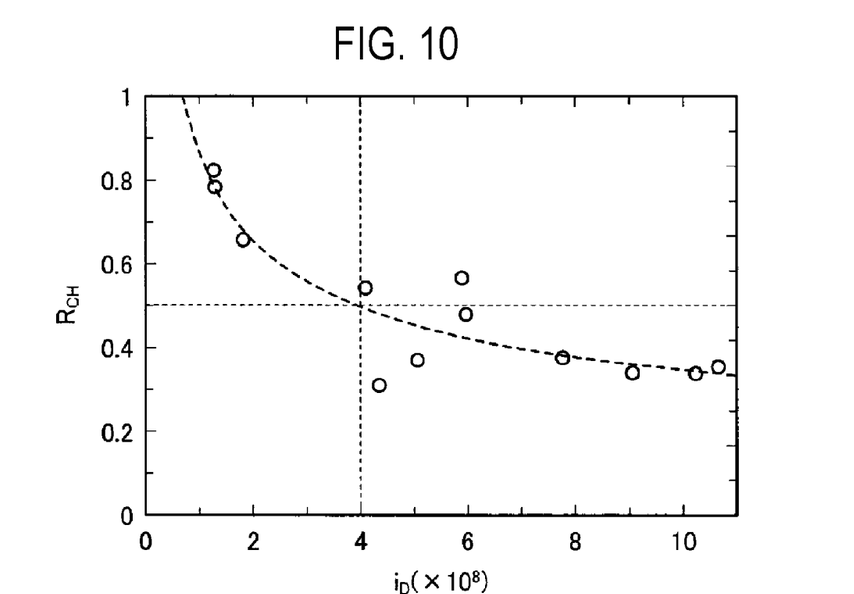
FIG. 10 is a diagram illustrating an example of a relationship between a dissociation index and a concentration ratio according to one embodiment of the present disclosure.

The dissociation index $i_D$ and the concentration ratio $R_{CH}$ had a relationship illustrated, for example, in FIG. 10. FIG. 10 is a diagram illustrating an example of the relationship between the dissociation index $i_D$ and the concentration ratio $R_{CH}$ in one embodiment of the present disclosure. Referring to FIG. 10, when the value of the dissociation index $i_D$ is $4\times10^8$ or less, the concentration ratio $R_{CH}$ is 0.5 or more. Therefore, the value of the dissociation index $i_D$ is preferably a value within a range larger than 0 and smaller than or equal to $4\times10^8$. That is, it is preferable that $0<(N_e \times T_e^2 \times \tau) \leq 4\times10^8$.

[Deposition Rate]

Figure 11:
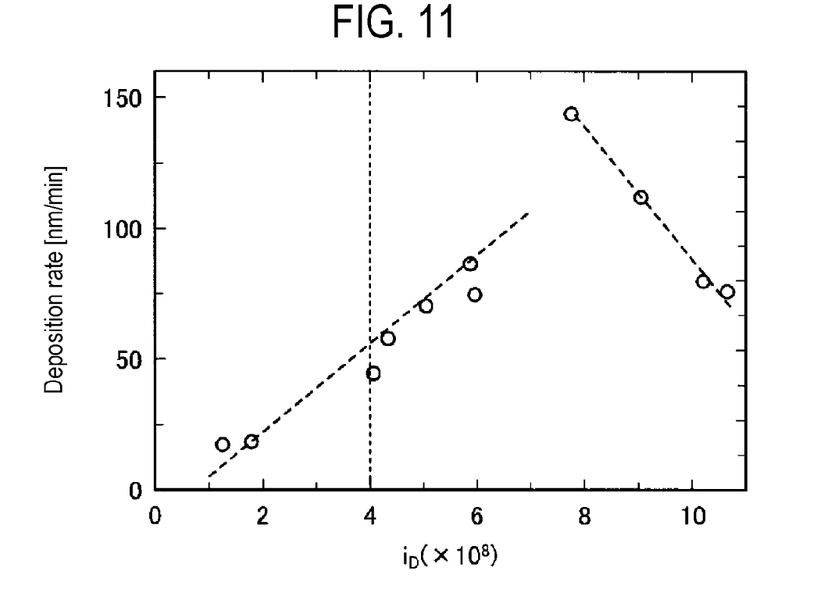
FIG. 11 is a diagram illustrating an example of a relationship between a dissociation index and a deposition rate according to one embodiment of the present disclosure.

FIG. 11 is a diagram illustrating an example of a relationship between the dissociation index $i_D$ and a deposition rate according to one embodiment of the present disclosure. For example, as illustrated in FIG. 11, in a range where the value of the dissociation index $i_D$ is 0 to $8\times10^8$, the deposition rate of the mask film tends to increase with the increase in the value of the dissociation index $i_D$. On the other hand, in a range where the value of the dissociation index $i_D$ is larger than $8\times10^8$, the deposition rate of the mask film tends to decrease with the increase in the value of the dissociation index $i_D$.

In order for the concentration ratio $R_{CH}$ to be 0.5 or more, it is preferable from the result of FIG. 10 that the value of the dissociation index $i_D$ is $4\times10^8$ or less. However, referring to FIG. 11, as the value of the dissociation index $i_D$ decreases, the deposition rate of the mask film decreases, thereby decreasing the productivity. Therefore, it is preferable that the value of the dissociation index $i_D$ is controlled to be a large value within the range of $4\times10^8$ or less.

[Content of Hydrogen Atoms]

In the mask film formed according to the present embodiment, a FTIR spectrum as illustrated, for example, in FIG. 6 was observed. With reference to FIG. 6, it can be seen that peaks of the methylene group $CH_2$ and the methyl group $CH_3$ are observed and the mask film contains some hydrogen atoms.

Figure 12:
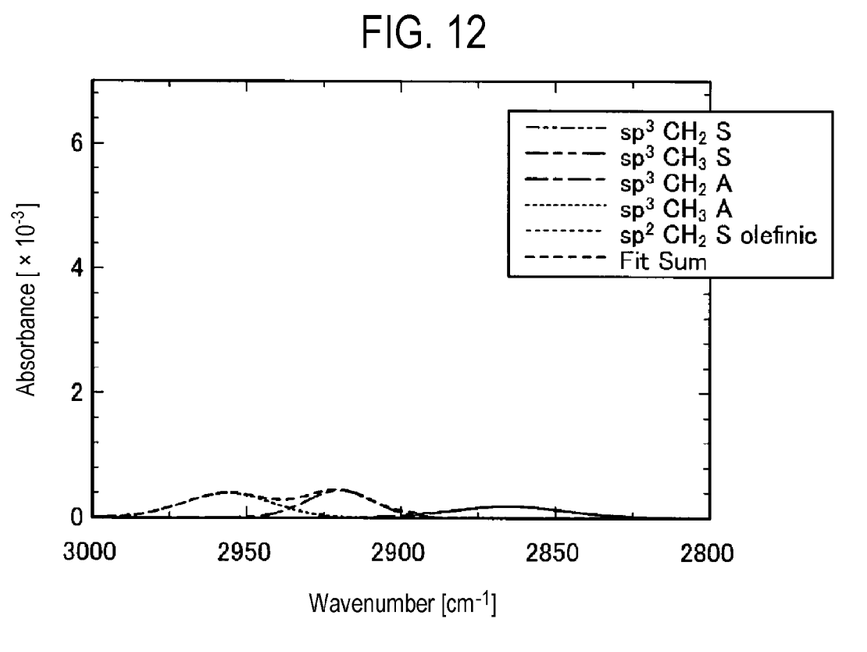
FIG. 12 is a diagram illustrating an example of a FTIR spectrum of a mask film according to a comparative example.

In contrast, in the mask film in the comparative example, a FTIR spectrum as illustrated, for example, in FIG. 12 was measured. FIG. 12 is a diagram illustrating an example of the FTIR spectrum of the mask film according to the comparative example. With reference to FIG. 12, almost no peak is seen at positions of wavenumbers corresponding to the methylene group $CH_2$ and the methyl group $CH_3$. Therefore, the content of hydrogen atoms in the mask film of the comparative example is lower than the content of hydrogen atoms in the mask film formed in the present embodiment.

The mask film of the comparative example is DLC having a low content of hydrogen atoms. When the content of hydrogen atoms in the DLC is low, a stress on the mask film increases. In contrast, the content of hydrogen atoms in the mask film formed in the present embodiment is higher than the content of hydrogen atoms in the mask film of the comparative example. Therefore, it is considered that the mask film formed in the present embodiment has a lower film stress than the mask film in the comparative example.

[Film-Forming Process]

Figure 13:
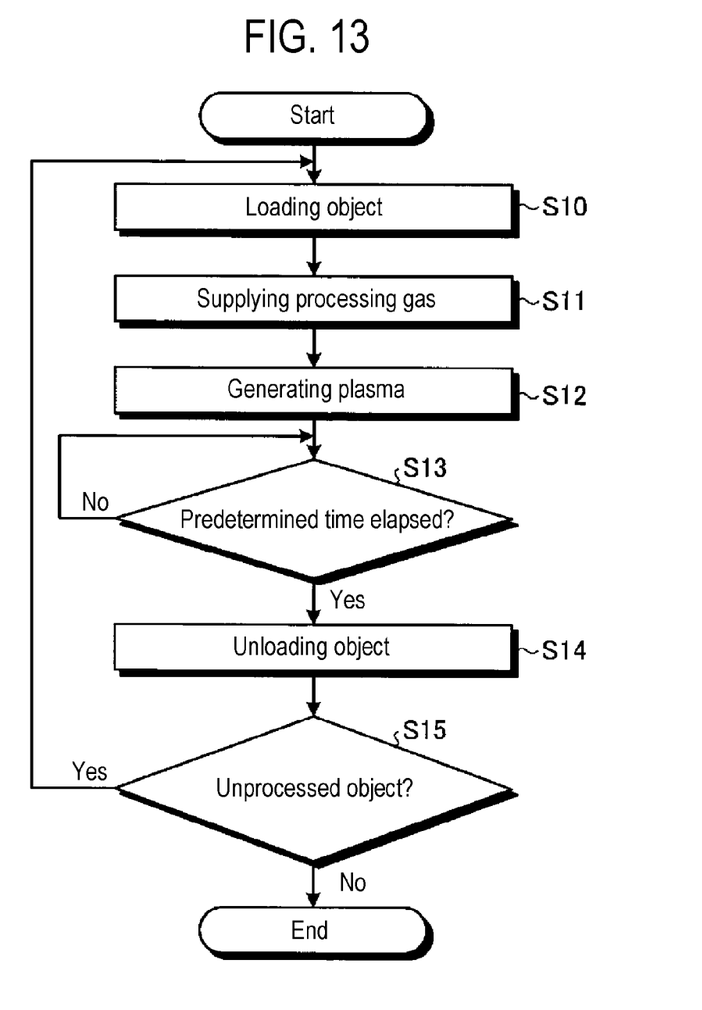
FIG. 13 is a flow chart illustrating an example of a method of forming a mask film according to one embodiment of the present disclosure.

FIG. 13 is a flow chart illustrating an example of a method of forming a mask film according to one embodiment of the present disclosure. The film forming method illustrated in FIG. 13 is realized mainly by the controller 100 controlling various parts of the device main body 11.

Before the film forming method illustrated in FIG. 13 is executed, in a preliminary experiment, the electron density $N_e$ is measured using the probe 60, and the excitation temperature $T_e$ of the hydrogen atom is measured using the spectrometer 72. Then, the electron density $N_e$, the excitation temperature $T_e$ of the hydrogen atom, and the residence time $\tau$ are adjusted so that the value of the dissociation index $i_D = N_e \times T_e^2 \times \tau$ is $4\times10^8$ or less. Specifically, the power and frequency of the radio frequency of the VHF band supplied from the radio frequency power supply 301, the distance between the partition plate 50 and the stage 20, and the like are adjusted. Then, the power and frequency of the radio frequency of the VHF band supplied from the radio frequency power supply 301, and the distance between the partition plate 50 and the stage 20 are specified in order for the value of the dissociation index $i_D$ to be $4\times10^8$ or less. In the following film forming method, the actuator 22 is controlled so that the distance between the partition plate 50 and the stage 20 becomes a specified distance. The distance between the partition plate 50 and the stage 20 is controlled to, for example, 30 [mm].

Hereinafter, an example of the film forming method will be described. First, an unprocessed object W is loaded into the chamber 15 by a robot arm (not shown) and is placed on the stage 20 (S10). Step S10 is an example of a loading process.

Next, the controller 100 controls the exhaust device 81 to vacuum-exhaust the interiors of the first plasma chamber S1 and the second plasma chamber S2. Then, the controller 100 controls the flow rate controller 400 to supply a hydrogen gas into the first plasma chamber S1 at a predetermined flow rate, and controls the flow rate controller 402 to supply a $CH_4$ gas into the second plasma chamber S2 at a predetermined flow rate (S11). In step S11, the flow rates of the hydrogen gas and the CH$_4$ gas are, for example, 50 [sccm] and 100 [sccm], respectively. Step S11 is an example of a supplying process.

Then, the controller 100 controls the APC valve 80 to adjust the internal pressures of the first plasma chamber S1 and the second plasma chamber S2. The internal pressures of the first plasma chamber S1 and the second plasma chamber S2 are adjusted to, for example, 4 [Pa].

Next, the controller 100 controls the microwave generator 300 to supply radio frequency power having a frequency of a microwave band into the first plasma chamber S1, and controls the radio frequency power supply 301 to supply radio frequency power having a frequency of a VHF band into the second plasma chamber S2. As a result, hydrogen gas plasma is generated in the first plasma chamber S1, and CH$_4$ gas plasma is generated in the second plasma chamber S2 (S12). The power and frequency of the radio frequency of the VHF band supplied from the radio frequency power supply 301 are power and frequency adjusted in a preliminary experiment so that the value of the dissociation index $i_D = N_e \times T_e^2 \times \tau$ is $4 \times 10^8$ or less. For example, radio frequency power of 2.45 [GHz] and 400 W is supplied into the first plasma chamber S1, and radio frequency power of 100 [MHz] and 100 [W] is supplied into the second plasma chamber S2.

Then, the controller 100 controls the radio frequency power supply 302 to supply radio frequency power of a predetermined frequency to the stage 20. As a result, charged particles in the second plasma chamber S2 are drawn to the object W on the stage 20, thereby forming a mask film on the object W. For example, radio frequency power of 13.56 [MHz] and 50 [W] is supplied to the stage 20. Step S12 is an example of a film-forming process.

Next, the controller 100 waits for a predetermined time until a mask film having a predetermined thickness is formed on the object W. Then, the controller 100 determines whether or not the predetermined time has elapsed since plasma was generated in the first plasma chamber S1 and the second plasma chamber S2 (S13). When the predetermined time has not elapsed ("No" in S13), the process shown in step S13 is executed again.

On the other hand, when the predetermined time has elapsed ("Yes" in S13), the controller 100 controls the power supply 30 to stop the supply of the radio frequency power into the first plasma chamber S1 and the second plasma chamber S2. Then, the controller 100 controls the flow rate controller 400 to stop the supply of the hydrogen gas into the first plasma chamber S1, and controls the flow rate controller 402 to stop the supply of the CH$_4$ gas into the second plasma chamber S2. Then, the controller 100 stops the exhaust device 81. Then, the object W on which the mask film is formed is unloaded from the chamber 15 by a robot arm (not shown) (S14).

Next, the controller 100 determines whether or not there is an unprocessed object W (S15). When there is an unprocessed object W ("Yes" in S15), the process shown in step S10 is executed again. On the other hand, when there is no untreated object W ("No" in S15), the film forming method shown in this flow chart is ended.

One embodiment has been described above. As described above, the mask film of the present embodiment is a carbon hard mask laminated on the etching target film, in which the concentration ratio of the methylene group CH$_2$ and the methyl group CH$_3$ contained in the carbon hard mask satisfies the following expression:

$$CH_2/(CH_2+CH_3) \geq 0.5$$

As a result, it possible to provide a carbon hard mask containing hydrogen atoms and having high etching resistance.

Further, the film forming apparatus 10 according to the above embodiment includes the chamber 15, the stage 20, the gas supply 40, the power supply 30, the actuator 22, and the APC valve 80. The stage 20 is provided in the chamber 15, and the object W is placed on the stage 20. The gas supply 40 supplies the hydrogen gas and the carbon-containing gas into the chamber 15. The power supply 30 supplies the power having a predetermined frequency into the chamber 15 to generate plasma of the hydrogen gas and the carbon-containing gas to form the carbon hard mask on the object W by the active species contained in the plasma. The APC valve 80 adjusts the internal pressure of the chamber 15. Further, the gas supply 40, the power supply 30, and the APC valve 80 are controlled so that the value of the product of the electron density $N_e$ [cm$^{-3}$] in the plasma, the excitation temperature $T_e$ [eV] of the hydrogen atom in the plasma, and the residence time $\tau$[ms] of a gas in the plasma satisfies the following expression:

$$0 < (N_e \times T_e^2 \times \tau) \leq 4 \times 10^8$$

As a result, it possible to provide a carbon hard mask containing hydrogen atoms and having high etching resistance.

Further, the film forming apparatus 10 according to the above embodiment further includes the actuator 22 that adjusts the volume of the space in which the plasma is generated. The residence time $\tau$ of the hydrogen gas and the carbon-containing gas in the plasma is controlled by changing at least one of the flow rates of the hydrogen gas and the carbon-containing gas, the internal pressure of the chamber 15, and the volume of the space in which the plasma is generated. As a result, it possible to form a carbon hard mask containing hydrogen atoms and having high etching resistance.

Further, the film forming method according to the above embodiment includes the loading process, the supplying process, and the film-forming process. In the loading step, the object W is loaded into the chamber 15, and the object W is placed on the stage 20 provided in the chamber 15. In the supplying process, the hydrogen gas and the carbon-containing gas are supplied into the chamber 15. In the film-forming process, plasma of the hydrogen gas and the carbon-containing gas is generated by supplying the power having a predetermined frequency into the chamber 15 to form the carbon hard mask on the object W by the active species contained in the plasma. Further, in the film forming method, the flow rates of the hydrogen gas and the carbon-containing gas, the frequency and magnitude of the power having a predetermined frequency supplied in the chamber 15, the volume of the space in which the plasma is generated, and the internal pressure of the chamber 15 are controlled so that the value of the product of the electron density $N_e$[cm$^{-3}$] in the plasma, the excitation temperature $T_e$[eV] of the hydrogen atom in the plasma, and the residence time $\tau$ [ms] of a gas in the plasma satisfies the following expression:

$$0 < (N_e \times T_e^2 \times \tau) \leq 4 \times 10^8$$

As a result, it possible to provide a carbon hard mask containing hydrogen atoms and having high etching resistance.

[Others]

Note that the technique disclosed in the present disclosure is not limited to the above embodiments, and many modifications can be made within the scope of the gist thereof.

For example, in the above embodiments, the hydrogen gas is turned into plasma by the power having a frequency of the microwave band and the carbon-containing gas is turned into plasma by the power having a frequency of the VHF band, but the disclosed technique is not limited thereto. For example, one of the power having a frequency of the microwave band and the power having a frequency of the VHF band may be used to turn the hydrogen gas and the carbon-containing gas into plasma.

When the power having a frequency of the microwave band is used to turn the hydrogen gas and the carbon-containing gas into plasma, the hydrogen gas and the carbon-containing gas are supplied into the first plasma chamber S1. In this case, the carbon-containing gas is not supplied into the diffusion space 52 of the partition plate 50. Further, the partition plate 50 is not supplied with the power having a frequency of the VHF band.

When the power having a frequency of the VHF band is used to turn the hydrogen gas and the carbon-containing gas into plasma, the power having a frequency of the microwave band is not supplied to the first plasma chamber S1. The hydrogen gas supplied into the first plasma chamber S1 is supplied into the second plasma chamber S2 via the through-ports 51 of the partition plate 50. Then, the hydrogen gas and the carbon-containing gas are turned into plasma in the second plasma chamber S2 by the power having a frequency of the VHF band supplied to the partition plate 50.

It should be considered that the embodiments disclosed this time are examples in all respects and are not restrictive. Indeed, the above embodiments can be embodied in a variety of forms. Further, the above embodiments may be omitted, replaced or changed in various forms without departing from the scope and spirit of the appended claims and the gist thereof.

EXPLANATION OF REFERENCE NUMERALS

S1: first plasma chamber, S2: second plasma chamber, W: object, 10: film forming apparatus, 11: device main body, 13: waveguide, 14: dielectric plate, 15: chamber, 16: insulating member, 18: quartz window, 20: stage, 21: support member, 22: actuator, 30: power supply, 300: microwave generator, 301: radio frequency power supply, 302: radio frequency power supply, 40: gas supply, 400: flow rate controller, 401: gas supply source, 402: flow rate controller, 403: gas supply source, 42: metal mesh, 50: partition plate, 51: through-port, 52: diffusion space, 53: discharge port, 60: probe, 61: network analyzer, 70: light receiving part, 71: optical fiber, 72: spectrometer, 80: APC valve, 81: exhaust device, 100: controller

What is claimed is:

1. A film forming apparatus comprising: a chamber; a stage provided in the chamber and having an object placed thereon; a gas supply configured to supply a hydrogen gas and a carbon-containing gas into the chamber; a power supply configured to supply power having a predetermined frequency into the chamber to generate plasma of the hydrogen gas and the carbon-containing gas to form a carbon hard mask on the object by active species contained in the plasma; and a pressure adjustment part configured to adjust an internal pressure of the chamber, a controller configured to control: the gas supply, the power supply, and the pressure adjustment part so that a value of a product of electron density ($N_e[\text{cm}^{-3}]$) in the plasma, an excitation temperature ($T_e[\text{eV}]$) of hydrogen atoms in the plasma, and a residence time ($\tau[\text{ms}]$) of a gas in the plasma satisfies a following expression (1):

$$0 < (N_e \times T_e^2 \times \tau) \leq 4 \times 10^8 \qquad (1).$$

2. The film forming apparatus of claim 1, further comprising: a volume adjustment part configured to adjust a volume of a space in which the plasma is generated, wherein the residence time ($\tau$) of the hydrogen gas and the carbon-containing gas in the plasma is controlled by changing at least one of flow rates of the hydrogen gas and the carbon-containing gas, an internal pressure of the chamber, and the volume of the space in which the plasma is generated.

3. A method of forming a film, comprising: loading an object into a chamber and placing the object on a stage provided in the chamber; supplying a hydrogen gas and a carbon-containing gas into the chamber; and supplying power having a predetermined frequency into the chamber to generate plasma of the hydrogen gas and the carbon-containing gas to form a carbon hard mask on the object by active species contained in the plasma, wherein flow rates of the hydrogen gas and the carbon-containing gas, the frequency and magnitude of power having a predetermined frequency supplied in the chamber, a volume of a space in which the plasma is generated, and an internal pressure of the chamber are controlled so that a value of the product of electron density ($N_e[\text{cm}^{-3}]$) in the plasma, an excitation temperature ($T_e[\text{eV}]$) of hydrogen atoms in the plasma, and a residence time ($\tau[\text{ms}]$) of a gas in the plasma satisfies a following expression (2):

$$0 < (N_e \times T_e^2 \times \tau) \leq 4 \times 10^8 \qquad (2).$$

* * * * *